United States Patent
Pelteshki et al.

(10) Patent No.: US 8,866,514 B2
(45) Date of Patent: *Oct. 21, 2014

(54) TRANSMIT DRIVER CIRCUIT

(71) Applicant: STMicroelectronics (Canada) Inc., Ottawa (CA)

(72) Inventors: Anton Pelteshki, Carleton Place (CA); Hock Khor, Nepean (CA)

(73) Assignee: STMicroelectronics (Canada) Inc., Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/078,190

(22) Filed: Nov. 12, 2013

(65) Prior Publication Data

US 2014/0077845 A1  Mar. 20, 2014

Related U.S. Application Data

(63) Continuation of application No. 13/333,729, filed on Dec. 21, 2011, now Pat. No. 8,587,348.

(60) Provisional application No. 61/427,630, filed on Dec. 28, 2010.

(51) Int. Cl.
*H03B 1/00* (2006.01)
*H04L 25/02* (2006.01)
*H03F 3/45* (2006.01)
*H03K 3/01* (2006.01)

(52) U.S. Cl.
CPC .............. *H03K 3/01* (2013.01); *H04L 25/0276* (2013.01); *H03F 2203/45712* (2013.01); *H03F 3/45183* (2013.01); *H03F 3/45179* (2013.01); *H04L 25/0282* (2013.01); *H04L 25/0266* (2013.01); *H03F 2203/45394* (2013.01)
USPC .......................................................... 327/108

(58) Field of Classification Search
USPC .................................................. 327/108, 112
See application file for complete search history.

(56) References Cited

U.S. PATENT DOCUMENTS

| 6,545,514 | B2 | 4/2003 | Barrow |
| 6,614,273 | B2 | 9/2003 | Teterud et al. |
| 7,061,279 | B1 | 6/2006 | Leete |
| 8,587,348 | B2 * | 11/2013 | Pelteshki et al. ............... 327/110 |

* cited by examiner

*Primary Examiner* — Hai L Nguyen
(74) *Attorney, Agent, or Firm* — Allen, Dyer, Doppelt, Milbrath & Gilchrist, P.A.

(57) ABSTRACT

A driver circuit includes a differential input, a differential output, a bias node, a first T-coil having a first node coupled to the negative output node and a second node coupled to a source of supply voltage, a second T-coil having a first node coupled to the positive output node and a second node coupled to the source of supply voltage, a first transistor having a current path coupled between the center tap of the first T-coil and a first intermediate node, a second transistor having a current path coupled between the center tap of the second T-coil and a second intermediate node, a third transistor having a current path coupled between the first intermediate node and ground, and a fourth transistor having a current path coupled between the second intermediate node and ground.

20 Claims, 1 Drawing Sheet

TRANSMIT DRIVER CIRCUIT

CROSS-REFERENCE TO RELATED APPLICATIONS

The present invention is a continuation of U.S. patent application Ser. No. 13/333,729 filed Dec. 21, 2011, now U.S. Pat. No. 8,587,348 issued on Nov. 19, 2013 which claims priority of U.S. Provisional Patent Application Ser. No. 61/427,630 filed Dec. 28, 2010, both of which applications are incorporated herein by this reference in their entireties.

FIELD OF THE INVENTION

The present invention relates to driver circuits, and more particularly to current mode logic (CML) type driver circuits.

BACKGROUND OF THE INVENTION

The following is a description of the design evolution of transmit (TX) driver circuits for rates up to 15 Gbps on a 32 nm process.

In a number of applications the classical current mode logic (CML) stage with a resistive load has been used as a driver of a transmission line with a 100Ω differential characteristic impedance. However, this type of circuit was found to have a limitation related to maintaining constant output impedance not dependent on an output state driven by the data-stream. This appears in low headroom by supply conditions when targeting the specified output swing of 1 Vppd.

The reduction of gate oxide thickness dictates reduction of supply voltage for CMOS logic circuits. The goal for the analog circuitry is to operate in the same supply domain of 1.0V as the 32 nm CMOS logic operates. This is possible with the right choice of circuit topologies in the analog design.

Ignoring the above non-linear issues, or assuming—solved, achieving a wide band of impedance matching is known to be possible by compensating the parasitic capacitances with use of inductors in shunt, series, series-shunt or "T-coil" configuration. All of these techniques work by splitting the contributors of total output capacitance.

These techniques should be applicable with any choice of driver stage.

Still, the limitations for applying these techniques are:
If the contributors of capacitance which could be split by an inductor have largely incomparable capacitance and the largest one cannot be split, or
If after splitting the capacitances the connectivity of one of them is being switched in circuit operation between nets with different potentials.

The linearity of the termination over the dynamic range of the output swing is limited by the shunting impedance of the transistors, driving the output port.

In the classical CML type driver stage 100 the amplitude is defined simply by a DC control on a tail current by transistor M3. The steering pair of transistors M1 and M2 operates in large signal mode, switching the common mode current to one of the half-output terminals defining two settled output states. If transistors M1 and M2 do not remain in saturation over the full output swing, the capacitance of the common source net CTAIL would be connected through a transistor in linear mode to one of the half-output ports, and thus it would cause data-dependent modulation of the reflection coefficient of the differential port.

It should be noted that for natural reasons $C_{TAIL} \gg C_0$. This is so because the two source terminals of the steering transistors plus the drain terminal of the current source have at least three times higher total capacitance than the one of the drain terminal of one steering transistor. This is the bottom limit of the capacitive ratio $C_{TAIL}/C_0$, which comes from pure theoretical geometrical considerations.

The asymmetry between the impedance of one half-output to the complementary one half-output (in the frequency band below the zero, introduced by resistance of the transistor in linear mode), is:

$$\frac{Z_{high}}{Z_{low}} = \frac{R_{LOAD}\|C_0}{R_{LOAD}\|(C_0 + C_{TAIL})}$$

$$C_{TAIL} \geq 3 \times C_0$$

$$=>$$

$$\frac{Z_{high}}{Z_{low}} = \frac{R_{LOAD}\|C_0}{R_{LOAD}\|4C_0}$$

The at least four times larger reactive load on the half-output versus the complementary one makes a mismatch in a limited band with the line impedance.

By TDR measurements it has been found that the half side impedances asymmetry is 50:37Ω. Besides causing reflection and reducing insertion to the differential line, it also causes asymmetry and thus, for common mode to differential conversion and vice versa, what leaks X-talk through supply rails direct coupling between TX/TX and between TX/RX channels (Far End Cross-Talk (FEXT) and Near End Cross-Talk (NEXT)—respectively).

The capacitance $C_0$ practically could be compensated by an on-chip inductor relatively simply. However, the capacitance $C_{TAIL}$ is first—a large value and second—its connectivity to the output being switched in the operation of the circuit.

What is desired is a simple driver circuit that overcomes the limitations of the prior art discussed above.

SUMMARY OF THE INVENTION

According to the present invention, a driver circuit includes a differential input including a positive input node and a negative input node, a differential output including a positive output node and a negative output node, a bias node, a first T-coil having a first node coupled to the negative output node, a center tap, and a second node coupled to a source of supply voltage, a second T-coil having a first node coupled to the positive output node, a center tap, and a second node coupled to the source of supply voltage, a first transistor having a current path coupled between the center tap of the first T-coil and a first intermediate node, and a control node coupled to the bias node, a second transistor having a current path coupled between the center tap of the second T-coil and a second intermediate node, and a control node coupled to the bias node, a third transistor having a current path coupled between the first intermediate node and ground, and a control node coupled to the positive input node, and a fourth transistor having a current path coupled between the second intermediate node and ground, and a control node coupled to the negative input node. The transistors in the driver circuit can be N-channel transistors. A first load resistor can be interposed between the second node of the first T-coil and the source of supply voltage, and a second load resistor can be interposed between the second node of the second T-coil and the source of supply voltage. A pair of capacitors can be coupled between the first intermediate node and ground, and the second intermediate node and ground. A pair of capacitors can be coupled between the center tap of the first T-coil and ground, and the center tap of the second T-coil and ground. A pair of capacitors can be coupled between the negative output node and ground, and the positive output node and ground. The bias node voltage can be provided using either feedback or feedforward circuitry. The source of supply voltage can be a low voltage supply having values down to one volt.

The newly adopted driver stage configuration according to the present invention keeps the simple definition of the output amplitude as in the classical CML stage, while extending the voltage range of linear impedance for the same supply voltage in comparison to the classical CML driver. This allows for the same swing to reduce the supply voltage.

DETAILED DESCRIPTION

Figure 1:
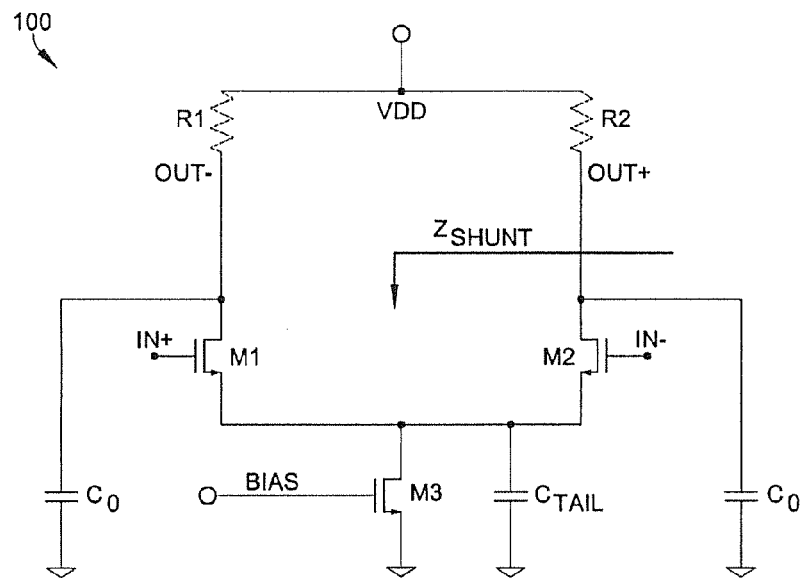
FIG. 1 is a schematic diagram of a driver circuit according to the prior art.
Figure 2:
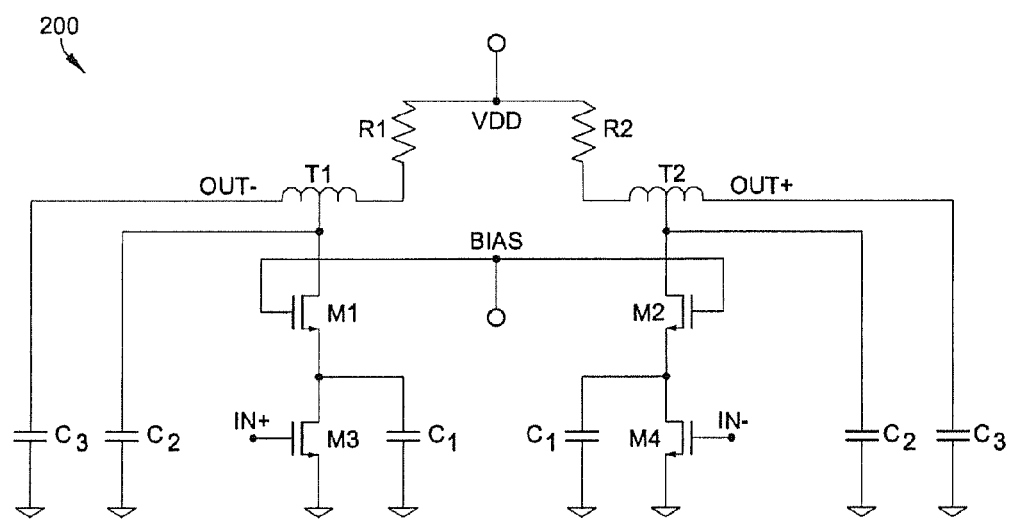
FIG. 2 is a schematic diagram of a driver circuit according to the present invention.

The circuit of the present invention effectively solves the problem of maintaining acceptable return loss for high power drivers at very high data rates near and above 10 Gb/s. There are two key improvements involved in the transmit driver of the present invention relative to prior art drivers. Firstly, the driver transistor configuration uses separate current limiting devices in each differential leg rather than the one common tail device of the CML configuration, and places the current limiting device above the switching device rather than below, with an equivalent bias voltage mirror to compensate for reduced drive current due to resistance of the switch device. Secondly, an inductor with a center tap terminal connected to the driver terminal, and its two end terminals connected to the termination resistor and output, respectively, is employed to add resonant peaking and to isolate the large driver capacitance while better reflecting the termination resistor impedance onto the output terminal at both low and high frequencies, resulting in improved return-loss performance.

The first improvement is that instead of a CML-type differential switching pair with a common tail current limiting device, each differential side is separate with its own series current limiting device placed above the switch rather than below. The extra resistance of the low-side series switch is compensated by the bias reference cell having an equivalent series switch. With this structure the transients from the switching devices are reduced because the series current limiting devices act as shields between the switches and the output. This structure has improved ability to maintain current drive at lower output voltage swing because the switches remain further into saturation, and better maintains output impedance and return-loss when output voltage is near analog ground (AGND). This is very important in achieving acceptable high frequency performance, particularly at 10 Gb/s and above. With the conventional CML differential pair and shared current limiting tail device, the differential pair begins to act as a differential short-circuit whenever the output signal is near its crossover point or, more generally, whenever both members of the differential pair move into triode region operation. The new structure moves away from triode region operation during switching rather than towards it, and both current limiting devices plus both switching devices are all in series between the differential outputs to maintain high differential driver impedance at all points throughout every switching transition.

The driver circuit of the present invention also uses a center-tapped peaking inductor for each differential side to offset the effect of lumped capacitance on both the output pad of the driver and on the drains of the output transistors. The center-tap connects to the large drive transistor drain where capacitance is problematic, one end connects to the output pad, and the other end connects to the termination resistor. Mutual inductance between the halves of the inductor and on each side of the center-tap make it an auto-transformer at high frequency with the drive transistor lumped drain capacitance tending to ground the center-tap, so the output node partially sees a direct image of the termination impedance plus some leakage inductance. The leakage inductance results in some series-resonant peaking between it and the capacitance of the driver plus the inductor. The inductor is limited in size to limit its capacitance and Q, both to limit peaking resonance.

The newly adopted driver circuit topology according to the present invention has the following benefits:

Increases the power efficiency by reducing the required DC supply voltage at which the stage becomes operating non-linearly by its output impedance; and Keeps the definition of output levels as simple as the classical CML circuit.

The proposed configuration 200 for the TX driver according to the present invention is shown in 2. Circuit 200 has a pair of transistors (M1/M2) in a common-gate configuration acting as a current-limiter defining the output amplitude in the similar simple way as it is defined in a CML driver. In series to the sources of transistors M1/M2 towards ground, a switch includes transistors M3/M4 respectively closes or opens the source connection of each half current limiter to the ground rail. In this cascoded driver the transistor, which provides definition for the operating current (M1/M2), also isolates the net capacitance at its source ($C_1$) from shunting the output.

In the conditions above in this topology there is no parasitic capacitor being switched to the output during the operation of the driver. This enables the use of the known capacitors splitting techniques. We have used the "T-coil" technique as shown, including coils $T_1$ and $T_2$.

FIG. 1 thus shows a cascoded driver circuit 200 with T-coil splitting the three parasitic capacitances: pad capacitance ($C_3$), drain capacitance ($C_2$), and termination resistor capacitance (not drawn).

The transistors M1/M2 in this topology are the only ones, which operate in saturation. This circuit 200 is suitable for 1.0V supply and allows a voltage swing of 1 Vppd.

The accompanying benefits of circuit 200 are described below. The switches M3/M4 are grounded, which allows them to be driven by $V_{GS}$ equal to the full-rail voltage by the pre-driver output. This also shrinks the sizes of these switches and reduces both parasitic capacitances: $C_1$ and gate capacitance loading the pre-driver. This also reduces dynamic power dissipation and area.

The biasing circuitry for the BIAS node is now described. The bias for the current limiting pair M1/M2 could be designed based on various circuits in feedforward topology or—sensing and regulating the output amplitude in a feedback topology.

One example for feedforward biasing is: using a scaled replica of the load resistor connected to the VDD rail and the scaled replica of the M1, M3 transistors with the M3 gate constantly connected to VDD rail. The desired amplitude could be set by a reference voltage referred to VDD and forced over the replica resistor by regulating the gate voltage of the replica of the M1 transistor. This regulated voltage is the feedforward bias for the M1/M2 pair that would produce the desired settled level over the output when one of M3/M4 is turned on by the pre-driver.

The generation of bias in a feedback configuration would not need the scaled replica. It would be the sensing of the output amplitude and forcing a given reference over the output resistor directly by regulating the gate voltage of M1/M2 as already described with the use of the replica of the stage.

Although a specific circuit embodiment of the invention has been disclosed along with certain alternatives (power supply polarity and device polarity may be flipped, component values may be selected as required for a particular application), it will be recognized by those skilled in the art that additional variations in form and detail may be made within the scope of the following claims.

We claim:

1. A driver circuit comprising:
   a differential input including a positive input node and a negative input node;
   a differential output including a positive output node and a negative output node;
   a bias node;
   a first T-coil having a first node coupled to the negative output node, a center tap, and a second node;
   a second T-coil having a first node coupled to the positive output node, a center tap, and a second node;
   a first transistor having a current path coupled between the center tap of the first T-coil and a first intermediate node, and a control node coupled to the bias node;
   a second transistor having a current path coupled between the center tap of the second T-coil and a second intermediate node, and a control node coupled to the bias node;
   a third transistor having a current path coupled between the first intermediate node and a common node, and a control node coupled to the positive input node; and
   a fourth transistor having a current path coupled between the second intermediate node and the common node, and a control node coupled to the negative input node.

2. The driver circuit of claim 1, wherein the first and second transistors comprise N-channel transistors.

3. The driver circuit of claim 1, wherein the third and fourth transistors comprise N-channel transistors.

4. The driver circuit of claim 1 further comprising a first load resistor interposed between the second node of the first T-coil and a source of supply voltage, and a second load resistor interposed between the second node of the second T-coil and the source of supply voltage.

5. The driver circuit of claim 1 further comprising a pair of capacitors coupled between the first intermediate node and the common node, and the second intermediate node and the common node.

6. The driver circuit of claim 1 further comprising a pair of capacitors coupled between the center tap of the first T-coil and the common node, and the center tap of the second T-coil and the common node.

7. The driver circuit of claim 1 further comprising a pair of capacitors coupled between the negative output node and the common node, and the positive output node and the common node.

8. The driver circuit of claim 1, wherein the bias node comprises a feedback bias node.

9. The driver circuit of claim 1, wherein the bias node comprises a feedforward bias node.

10. The driver circuit of claim 1, wherein the source of supply voltage has a value greater than or equal to one volt.

11. A driver circuit comprising:
    a differential input including a positive input node and a negative input node;
    a differential output including a positive output node and a negative output node;
    a bias node;
    a first T-coil having a first node coupled to the negative output node, a center tap, and a second node;
    a second T-coil having a first node coupled to the positive output node, a center tap, and a second node;
    a cascode stage having a first current path coupled between the center tap of the first T-coil and a first intermediate node, a first control node coupled to the bias node, a second current path coupled between the center tap of the second T-coil and a second intermediate node, and a second control node coupled to the bias node;
    a differential stage having a first current path coupled between the first intermediate node and the common node, a first control node coupled to the positive input node, a second current path coupled between the second intermediate node and a common node, and a second control node coupled to the negative input node.

12. The driver circuit of claim 11, wherein the cascode stage comprises N-channel transistors.

13. The driver circuit of claim 11, wherein the differential stage comprises N-channel transistors.

14. The driver circuit of claim 11 further comprising a first load resistor interposed between the second node of the first T-coil and a source of supply voltage, and a second load resistor interposed between the second node of the second T-coil and the source of supply voltage.

15. The driver circuit of claim 11 further comprising a pair of capacitors coupled between the first intermediate node and the common node, and the second intermediate node and the common node.

16. The driver circuit of claim 11 further comprising a pair of capacitors coupled between the center tap of the first T-coil and the common node, and the center tap of the second T-coil and the common node.

17. The driver circuit of claim 11 further comprising a pair of capacitors coupled between the negative output node and the common node, and the positive output node and the common node.

18. The driver circuit of claim 11, wherein the bias node comprises a feedback bias node.

19. The driver circuit of claim 11, wherein the bias node comprises a feedforward bias node.

20. The driver circuit of claim 11, wherein the source of supply voltage has a value greater than or equal to one volt.

* * * * *